United States Patent
Mielnik et al.

(10) Patent No.: US 10,845,773 B2
(45) Date of Patent: Nov. 24, 2020

(54) SELECTOR FOR FIELD DEVICES

(71) Applicant: ABB Schweiz AG, Baden (CH)

(72) Inventors: David Mielnik, Painsville, OH (US); Richard Ogorek, Sagamore Hills, OH (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/282,838

(22) Filed: Feb. 22, 2019

(65) Prior Publication Data

US 2020/0272119 A1    Aug. 27, 2020

(51) Int. Cl.
| | | |
|---|---|---|
| G05B 19/042 | (2006.01) | |
| G05B 15/02 | (2006.01) | |
| H01R 13/11 | (2006.01) | |
| H05K 7/14 | (2006.01) | |
| H05K 1/18 | (2006.01) | |
| G06F 13/40 | (2006.01) | |

(52) U.S. Cl.
CPC ......... *G05B 19/0423* (2013.01); *G05B 15/02* (2013.01); *G06F 13/4022* (2013.01); *H01R 13/11* (2013.01); *H05K 1/18* (2013.01); *H05K 7/1478* (2013.01)

(58) Field of Classification Search
CPC .. H05K 7/14; H05K 7/20; H05K 1/18; H05K 7/1478; G05B 19/0423; G05B 15/02; G06F 13/4022; H01R 13/11; G08B 21/00
See application file for complete search history.

(56) References Cited

U.S. PATENT DOCUMENTS

| | | | | |
|---|---|---|---|---|
| 6,215,204 | B1 * | 4/2001 | Brown | H05K 7/1471 307/326 |
| 6,686,672 | B2 * | 2/2004 | Brown | H05K 7/1471 307/125 |
| 7,476,802 | B2 * | 1/2009 | Cane | H05K 5/061 174/50 |
| 9,864,352 | B2 * | 1/2018 | Kang | G05B 15/02 |
| 10,368,458 | B2 * | 7/2019 | Mielnik | H05K 5/0017 |
| 10,462,924 | B2 * | 10/2019 | Mielnik | H05K 7/1467 |
| 2003/0008551 | A1 | 1/2003 | Chang | |
| 2003/0125821 | A1 | 7/2003 | Trotter et al. | |
| 2004/0010324 | A1 | 1/2004 | Bednar et al. | |
| 2006/0020350 | A1 | 1/2006 | Khanchin | |
| 2006/0030968 | A1 | 2/2006 | Ko et al. | |

(Continued)

FOREIGN PATENT DOCUMENTS

DE        10135980 C1    4/2003

OTHER PUBLICATIONS

European Patent Office, International Search Report and Written Opinion issued in corresponding International application No. PCT/IB2020/052955, dated Jul. 16, 2020, 17 pp.

*Primary Examiner* — Abdullah A Riyami
*Assistant Examiner* — Nader J Alhawamdeh
(74) *Attorney, Agent, or Firm* — Taft Stettinius & Hollister LLP; J. Bruce Schelkopf

(57) ABSTRACT

A selector is provided for configuring field devices in a control system. A set of pins is connected to the field device. The field device configuration can be changed by interconnecting different pins in the pin set. Multiple pin selectors are provided with different arrangements of connectors for interconnecting the pins. Thus, the field device may be easily configured by connecting a particular pin selector onto the pins that matches the desired configuration.

20 Claims, 9 Drawing Sheets

(56) References Cited

U.S. PATENT DOCUMENTS

| | | |
|---|---|---|
| 2008/0194138 A1 | 8/2008 | Wu et al. |
| 2009/0223802 A1 | 9/2009 | Zak |
| 2014/0156900 A1 | 6/2014 | Gruber et al. |
| 2015/0341185 A1 | 11/2015 | Keller |
| 2017/0367208 A1* | 12/2017 | Mielnik ............. H05K 7/20127 |
| 2018/0199439 A1 | 7/2018 | Kreuter |

* cited by examiner

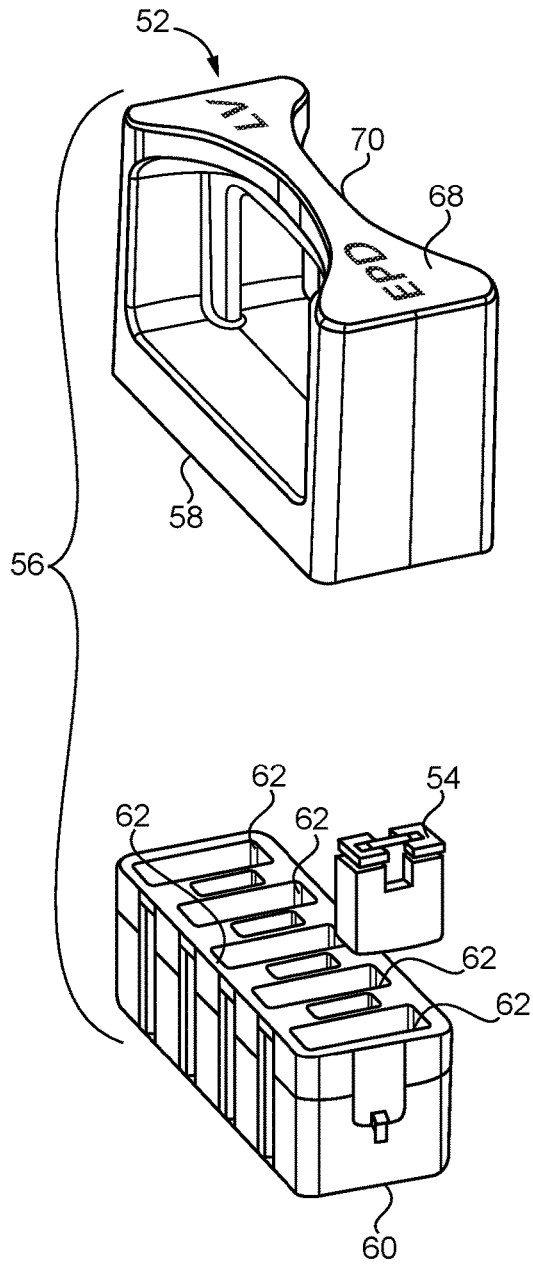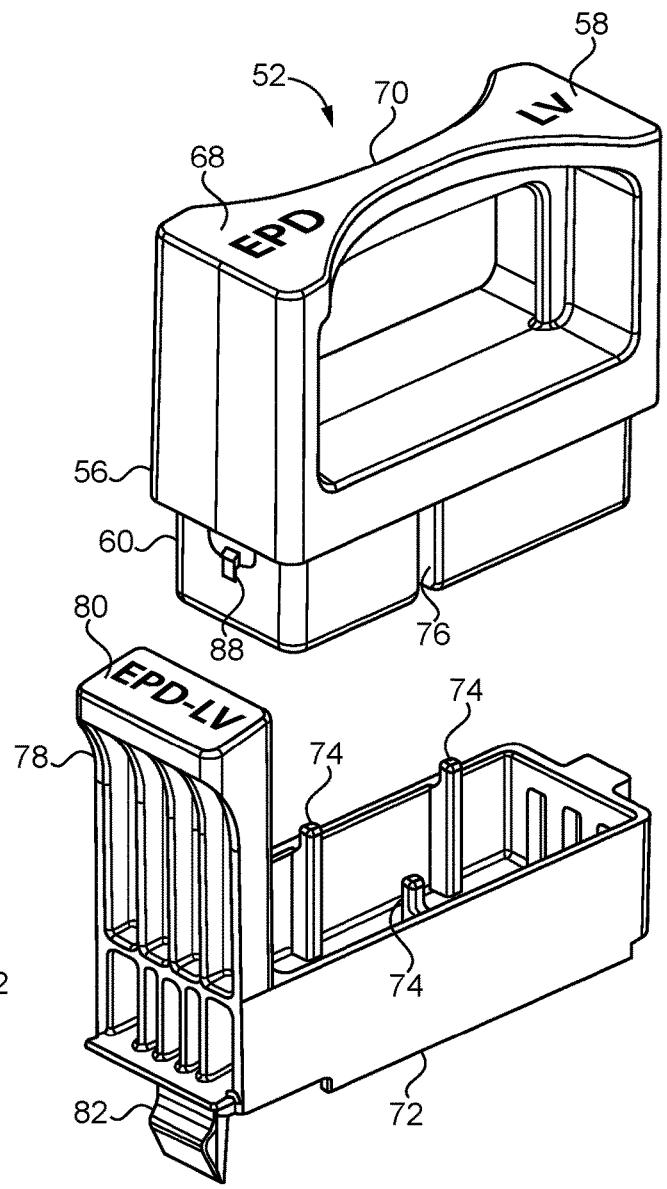
FIG. 7
FIG. 8

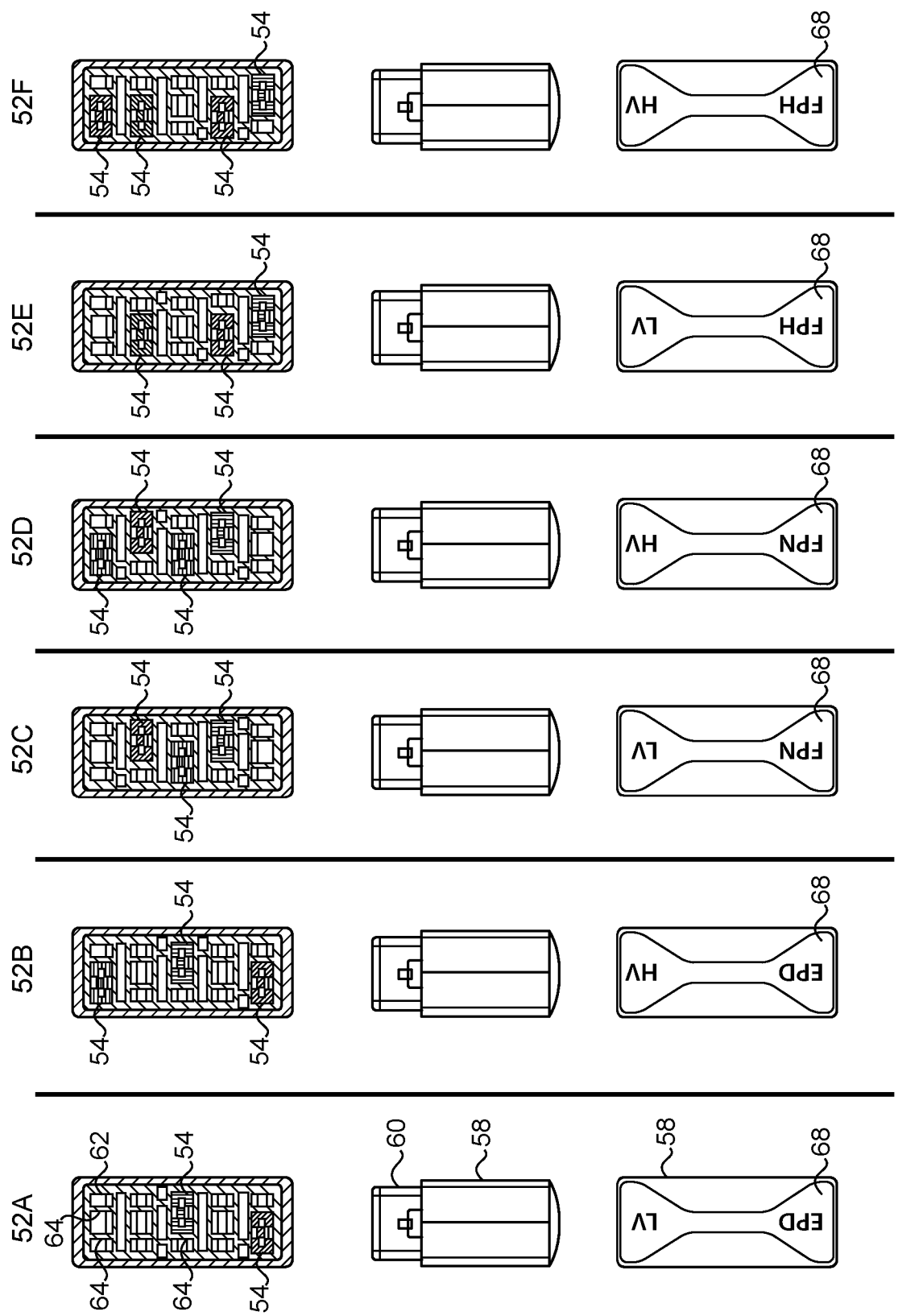

SELECTOR FOR FIELD DEVICES

BACKGROUND

The present inventions relate generally to controllers, and more particularly, to alternative selectors for changing interconnections with field devices.

Control systems interact with a variety of field devices, such as sensors and actuators, to monitor and control numerous types of industrial processes. In some cases where the industrial process is complex, a control system can be required to interact with a large number of field devices. Different types of field devices can also have different interconnection requirements. For example, some field devices may be self-powered or may obtain power in the field from a battery or other power system. On the other hand, other field devices may require power to be supplied from the control system that is connected to the field device. It is also possible for field devices to have different interconnection requirements with the control system for transferring data therebetween. Thus, it can be difficult to design a control system that includes numerous field devices, each of which may have different connection requirements.

One way that this problem has been dealt with is to design different types of communications modules that are compatible with particular types of field devices. In this arrangement, field devices having similar interconnection requirements can be grouped together on special communication modules that are compatible with the group of field devices. However, this requires numerous different types of communications modules to be provided in order to interconnect all of the various types of field devices that may be used in a particular control system. This raises expenses and complexity in setting up the system.

Therefore, it would be preferable to provide a universal communications module that can be easily configured to connect various types of field devices with different interconnection requirements.

SUMMARY

A universal communications module is described for communicating with field devices. The communications module has separate data paths for each field device that may be easily configured according to the particular requirements of the field device. Thus, field devices of different types having different power and/or communications requirements can be supported by a single universal communications module. Each data channel has a set of pins connected to the field device, the power supply and the signal processing module. Pin selectors with different arrangements of connectors are provided to interconnect the pins according to the requirements of particular types of field devices.

BRIEF DESCRIPTION OF SEVERAL VIEWS OF THE DRAWINGS

The invention may be more fully understood by reading the following description in conjunction with the drawings, in which:

FIG. 7 is an exploded view of a pin selector;

FIG. 8 is a side perspective view of a pin selector and a pin selector key;

FIG. 11 is a schematic view of different pin selectors showing different connection arrangements.

DETAILED DESCRIPTION

Figure 2:
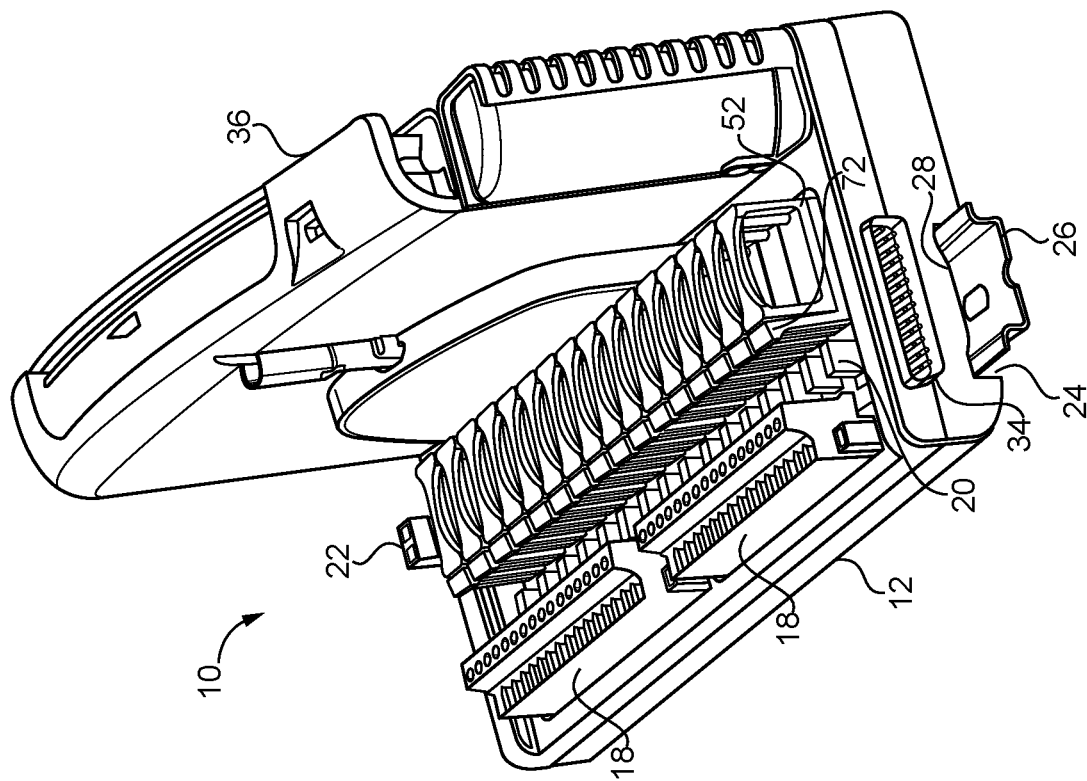
FIG. 2 is a perspective view of the universal communications module with pin selectors, pin selector keys and signal processing module connected to the base.
Figure 1:
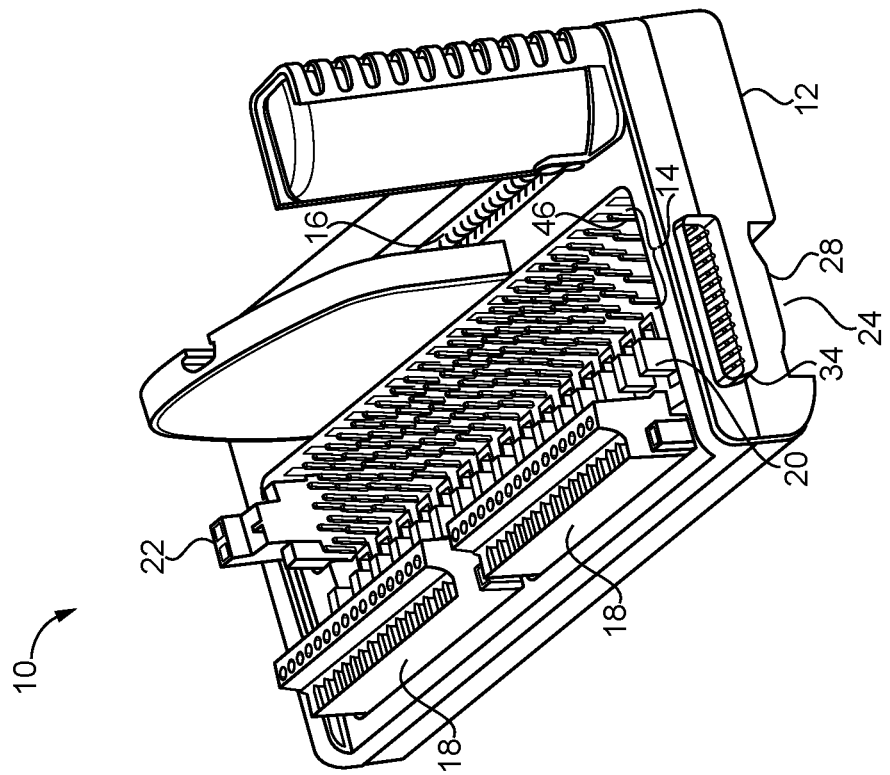
FIG. 1 is a perspective view of a universal communications module with pin selectors, pin selector keys and signal processing module removed from the base.
Figure 3:
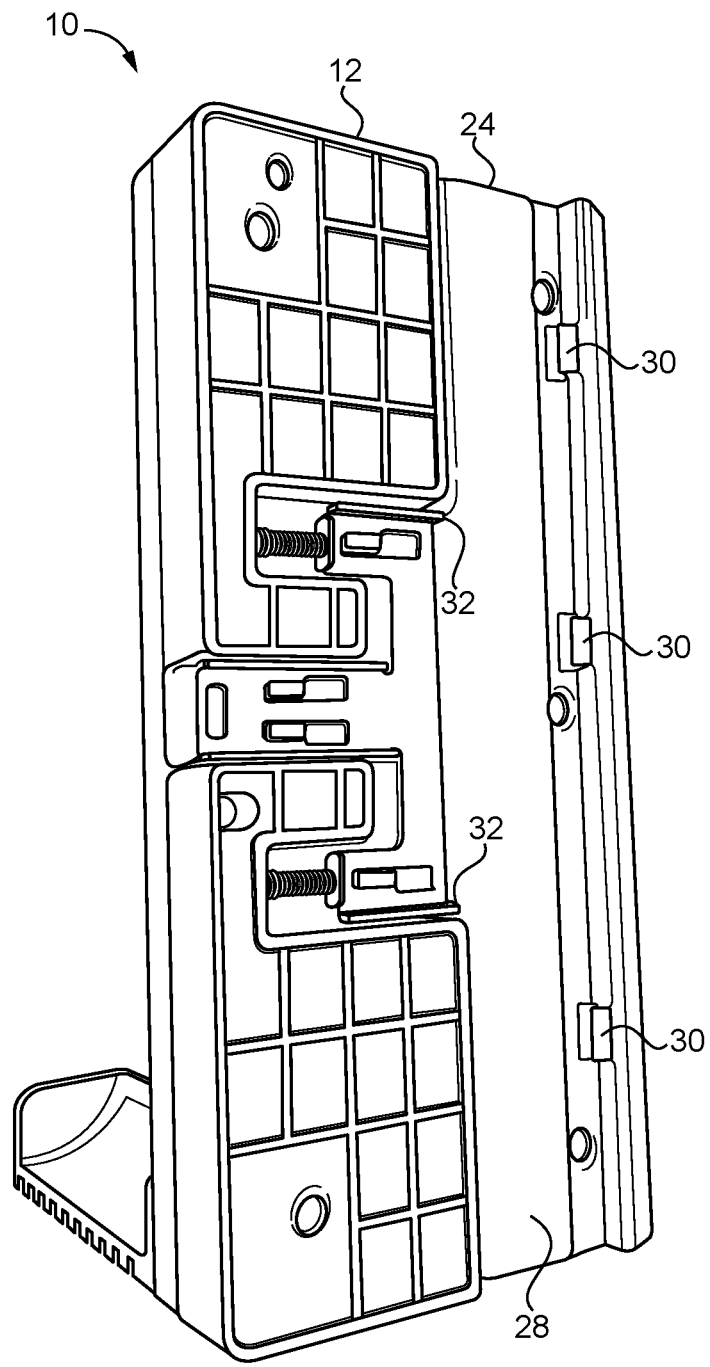
FIG. 3 is a perspective view of the back side of the base.

Referring now to the figures, and particularly FIGS. 1-3, a universal communications module 10 is shown. In FIG. 1, the module 10 is shown with the pin selectors 52, pin selector keys 72, and signal processing module 36 removed. In FIG. 2, the pin selectors 52, pin selector keys 72, and signal processing module 36 are connected to the module 10. As shown in FIG. 1, the module 10 has a base 12 with a plurality of pin sets 14 that the pin selector keys 72 and pin selectors 52 are connected to. The base 12 also includes a module connector 16 for connecting the signal processing module 36 to the base 12. The base 12 also includes a series of field device connectors 18 and fuses 20 corresponding to each pin set 14. A power supply connector 22 is also provided on the base 12. As shown in FIG. 3, the back side of the base 12 may be provided with a DIN rail connector 24 to mount the universal communications module 10 on a DIN rail 26 in an industrial facility. The DIN rail connector 24 includes a slot 28 for a DIN rail 26 (FIG. 2), fixed hooks 30 for engaging the DIN rail 26, and spring-loaded, slidable hooks 32 for engaging and disengaging the DIN rail 26.

Figure 4:
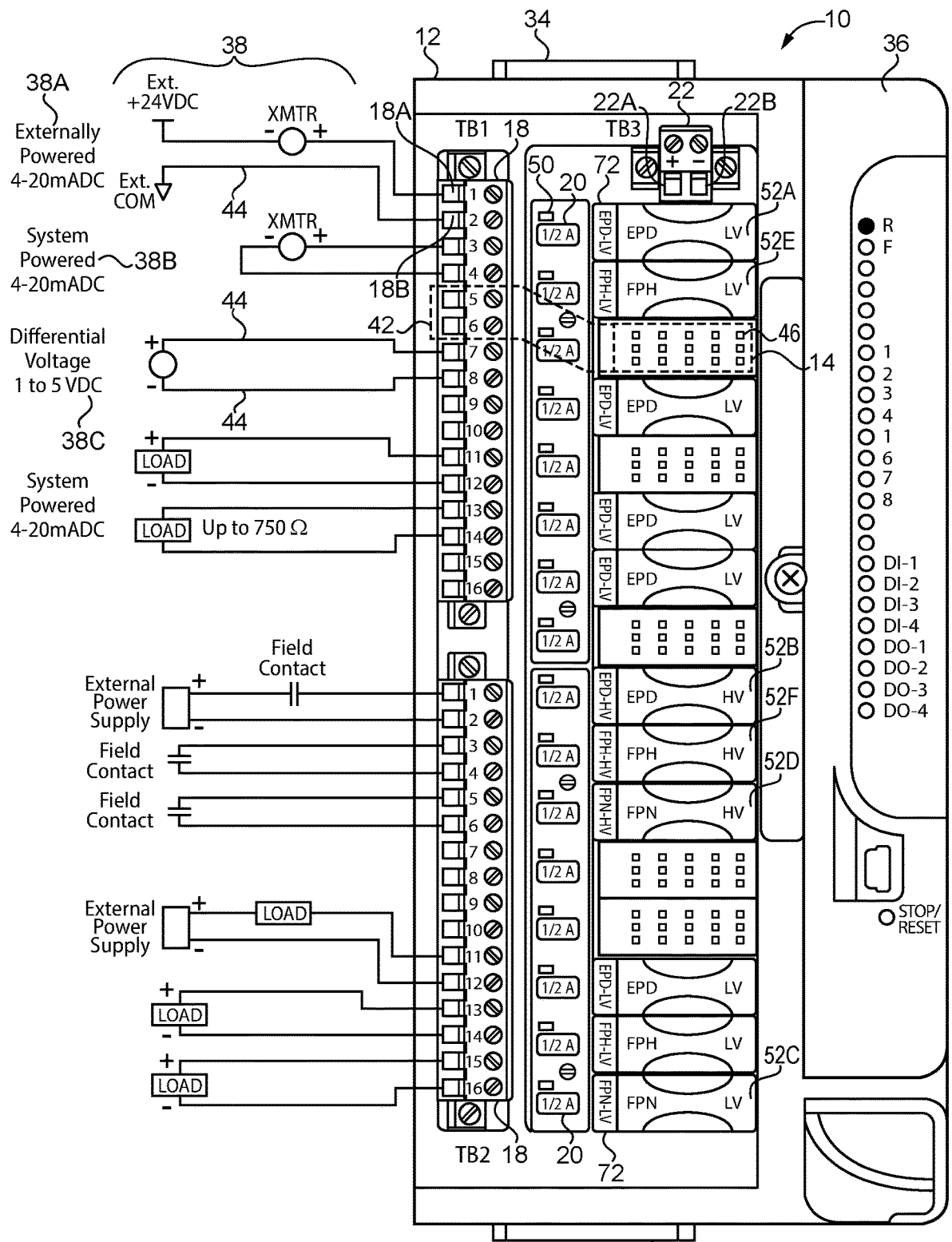
FIG. 4 is a top view of the universal communications module showing connections to field devices.
Figure 12A:
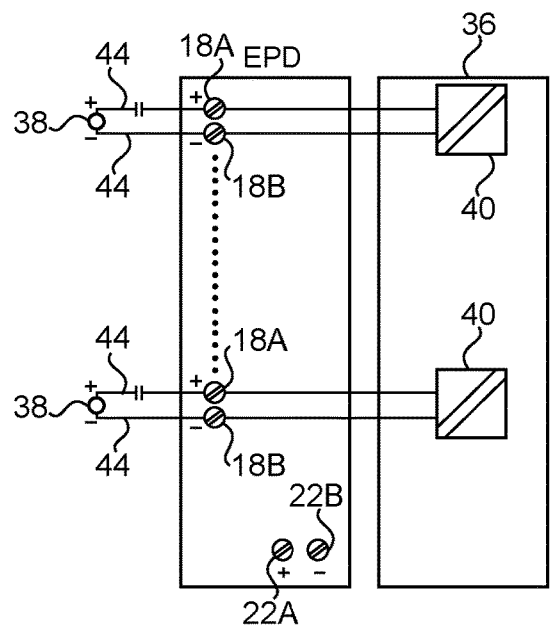
FIGS. 12A-12C are schematic views showing different connection arrangements between field device connectors, a power supply and signal processors.

The base 12 is also provided with a data port 34. The data port 34 preferably transmits addressable data to and from the signal processing module 36, which communicates data to and from sensors 38 and actuators 38 (i.e., field devices 38) connected to the field connectors 18. As shown in FIG. 4, it may be particularly preferable for the base 12 to have a data port 34 on each end of the base 12 (with one being a male connection and the other being a female connection). In this arrangement, the data ports 34 may be serial ports 34 and multiple communications modules 10 may be connected together with the data ports 34. The data ports 34 may thus form a data bus in communication with a central process controller. Although it is possible for the signal processing module 36 plugged into the base 12 to perform process control functions (in other words, process the signals received from the field devices 38), it is most preferred for the signal processing module 36 to be limited to I/O functions. That is, the signal processing module 36 conditions and/or converts the signals received from and transmitted to the field devices 38 to allow a central process controller to communicate with each field device 38. Even more preferred, as shown in FIG. 12A, the signal processing module 36 may include a plurality of separate signal processors 40 with limited or no communication therebetween. Thus, each signal processor 40 is assigned to a corresponding field connector 18 to process signals between the respective field device 38 and a central process controller. After passing through a respective signal processor 40, the processed signals are transmitted to and from a central process controller through the data ports 34. Thus, in the preferred embodiment, the signal processors 40 do not apply control logic between different field devices 38 (i.e., separate data channels 42), but instead, allow communication between the field devices 38 and a central process controller which applies control logic between different field devices 38.

As shown in FIG. 4, a variety of different field devices 38 may be connected to the field device connectors 18 with field wires 44. Typically, each field device connector 18 will include two connectors 18A, 18B, with one being a positive voltage connector 18A and one being a ground connector 18B. Thus, each field device 38 is connected to the base 12 with two wires 44. However, the power and data requirements of each field device 38 may differ from each other in a way that must be accommodated by the base 12 and signal processing module 36. For example, some devices 38A may provide their own power and transmit or receive data within an analog range of 4-20 mADC. Other devices 38B may require power to be supplied from the base 12 in an analog range of 4-20 mADC. Other devices 38C may require power to be supplied in an analog or digital range of 1-5 VDC. The various types of field devices 38 that may be used with the universal communications module 10 typically conform to industry standards which are well-known. It is common (although not always the case) for the field devices 38 to communicate with analog signals. Thus, one function of the signal processing module 36 is to convert the analog signals to digital data and provide addressing data to allow a central process controller to utilize data from the field devices 38.

Figure 5:
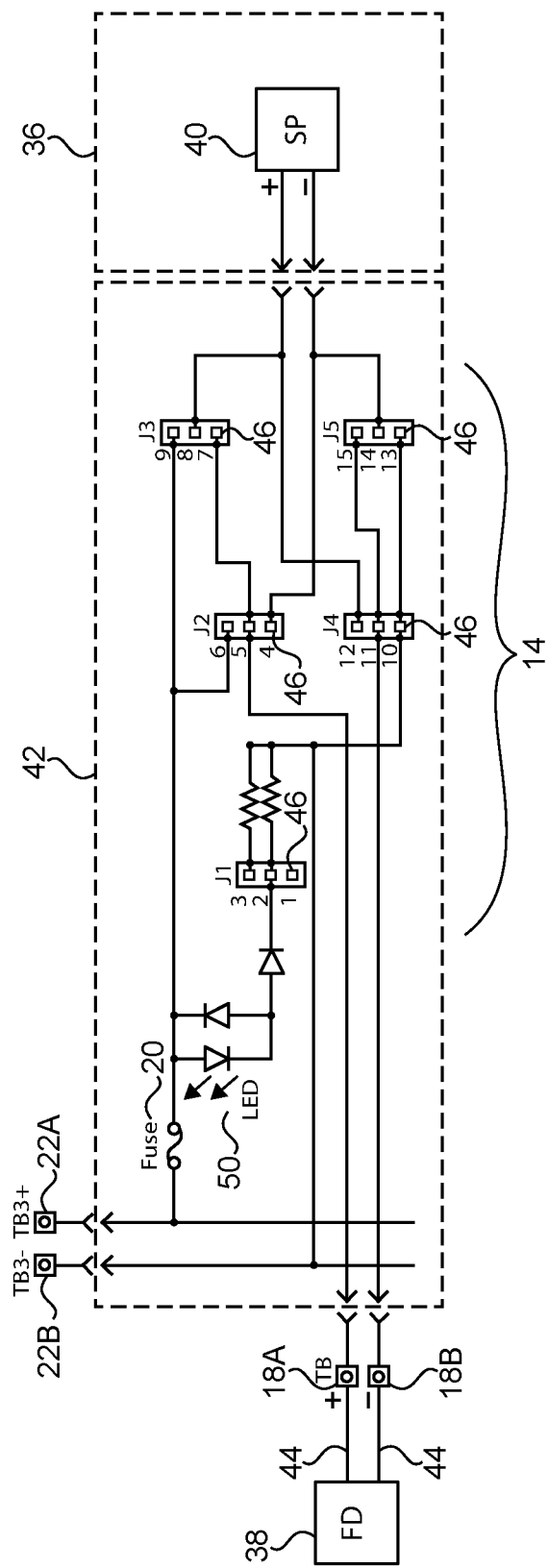
FIG. 5 is a schematic view of a single data channel.

As further shown in FIG. 4, each field device connector 18 is associated with a set 14 of pins 46, a fuse 20, and a status light 50 to form a data channel 42 in communication with the signal processing module 36 (and preferably with a respective signal processor 40). In the preferred embodiment, each set 14 of pins 46 is arranged in five rows with three pins 46 in each row for a total of 15 pins 46 in each set 14 (i.e., each channel 42). As shown in FIG. 5, a portion of the pins 46 is connected to the respective field device connector 18; another portion of the pins 46 is connected to the power supply connector 22; and another portion of the pins 46 is connected to the respective signal processor 40. Thus, depending on how the pins 46 are interconnected with each other, different arrangements of power and data communication may be provided between the field device 38, power supply 22 and signal processor 40.

Figure 12B:
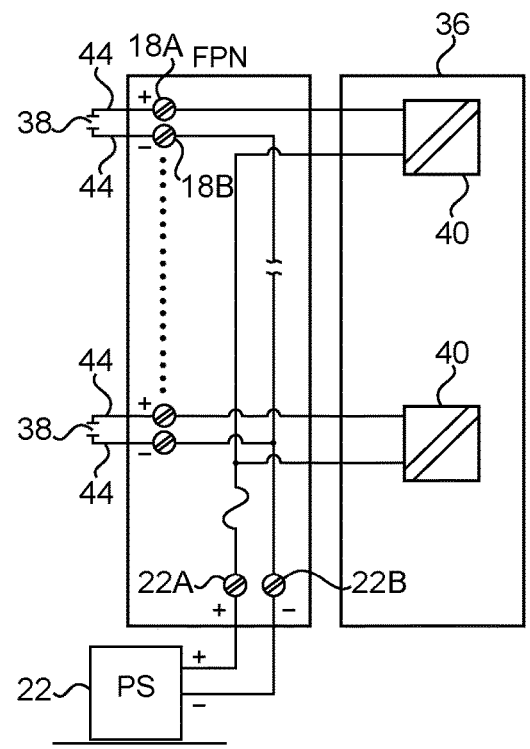
Figure 12C:
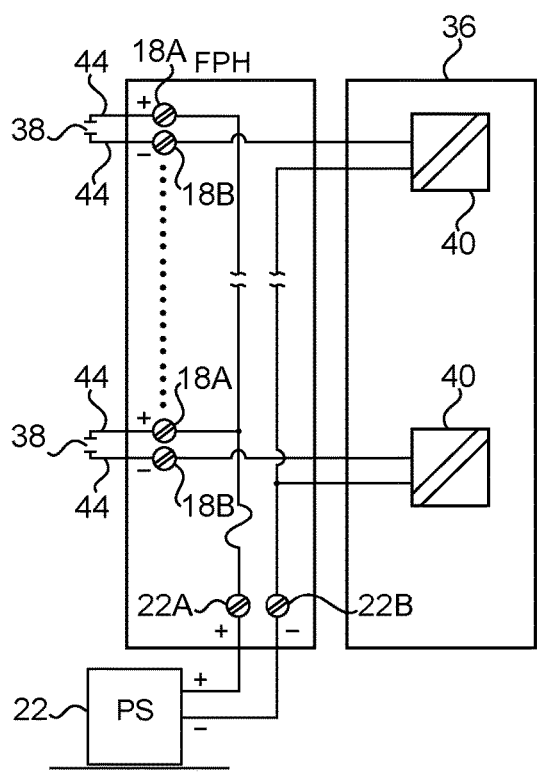

As shown in FIG. 12A, one arrangement that may be desirable is for the field device connector 18 to be connected to the signal processor 40 without connecting the field device connector 18 to the power supply connector 22. This arrangement would typically be used where the field device 38 has a separate power supply or a power supply is not needed. This arrangement may be labeled EPD for Externally PowereD. Another possible arrangement is shown in FIG. 12B. In this arrangement, the field device connector 18 is connected to the power supply connector 22, but specifically in a way that the ground connectors 22B, 18B of the power supply 22 and the field device connector 18 are directly connected together. The positive connectors 22A, 18A of the power supply 22 and the field device connector 18 are indirectly connected by connecting both connectors 22A, 18A to the signal processor 40. This arrangement may be labeled FPN for Field Power Neutral. Yet another arrangement is shown in FIG. 12C. In this arrangement, the positive connectors 22A, 18A of the power supply 22 and the field device connector 18 are directly connected together and the ground connectors 22B, 18B of the power supply 22 and the field device connector 18 are indirectly connected by connecting both connectors 22B, 18B to the signal processor 40. This arrangement may be labeled FPH for Field Power High. Other arrangements may also be desirable. For example, it may be desirable to adjust a voltage output from the power supply 22 to a particular desired voltage output. For example, in the preferred embodiment, each data channel 42 is provided with a status indicator light 50, which may be an LED 50 that requires a voltage supply within a particular range. Thus, depending on how the pins 46 are interconnected with each other (FIG. 5), the voltage from the power supply 22 can be adjusted to suit the power requirements of the LED 50 or another component. These alternative arrangements may be labeled LV for Low Voltage and HV for High Voltage.

Various pin 46 connections to achieve the arrangements described above, and others that may be desired, may be accomplished with the pin selectors 52. Preferably, multiple pin selectors 52 are provided with different arrangements of connectors 54 therein to interconnect different pins 46 together in a set 14 of pins 46. In the described examples, it may be desirable to provide six different pin selectors 52A-F, with each being visually labeled as EPD LV 52A, EPD HV 52B, FPN LV 52C, FPN HV 52D, FPH LV 52E and FPH HV 52F. As shown in FIG. 11, each pin selector 52A-F has a different arrangement of connectors 54 to connect together different portions of the pins 46 in a respective set 14 of pins 46 (also refer to FIG. 5). Thus, the data channels 42 can be separately configurable depending on which pin selector 52 is connected to the set 14 of pins 46. Another advantage is that the field device connector 18 can be completely disconnected from the power supply 22 and/or signal processing module 36 by removing the respective pin selector 52 from the set 14 of pins 46. This may be useful when it is desired to test the field wires 44 or field device 38 without any influence from the power supply 22 or signal processing module 36.

Figure 9:
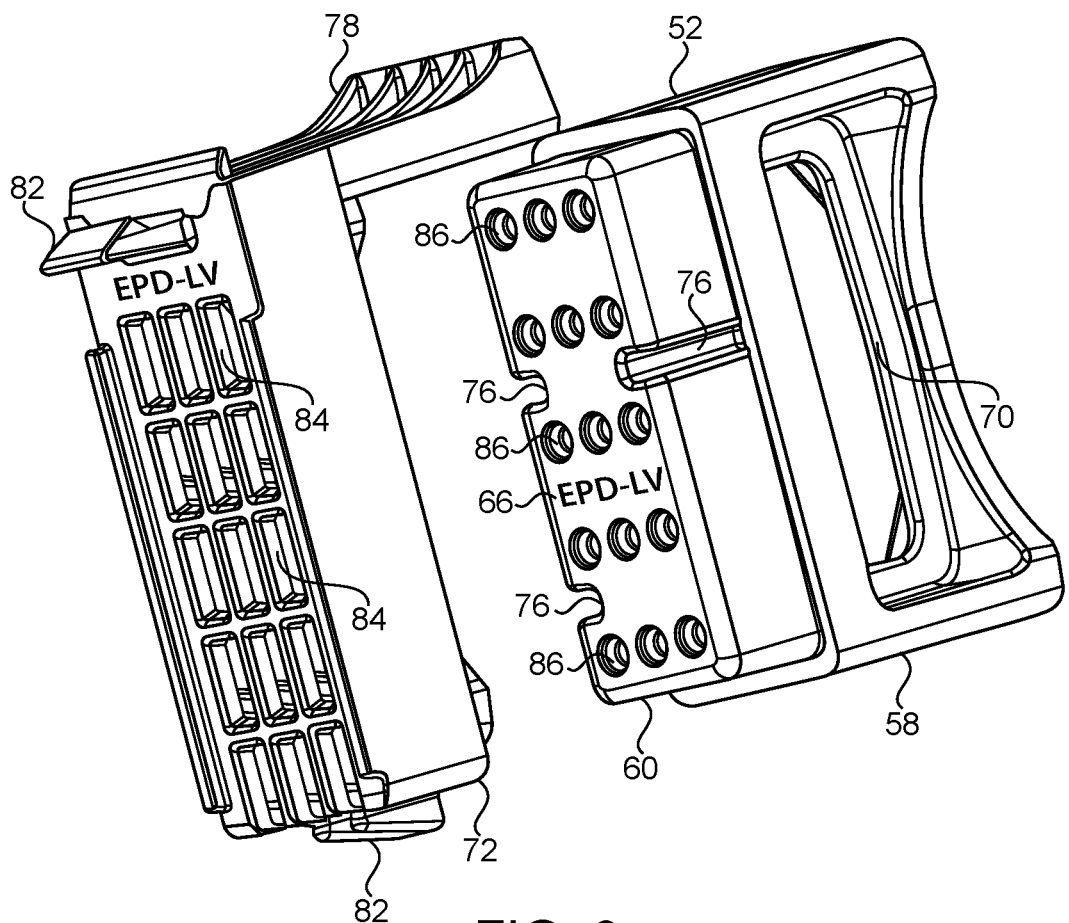
FIG. 9 is a bottom perspective view of a pin selector and a pin selector key.

As shown in FIG. 7, the connectors 54 in the pin selector 52 for connecting together pins 46 in the pins sets 14 may be conventional printed circuit board jumper caps 54. In this embodiment, the pin selector 52 may have a housing 56 with a molded plastic top portion 58 and a molded plastic bottom portion 60. The bottom portion 60 may have a cavity 62 to receive a jumper 54 corresponding with one or more of the rows of pins 46. Although not visible in FIG. 7, the cavity 62 may be formed such that the jumper 54 is positioned either on the right or the left to engage the middle pin 46 in a row and either the right or left pin 46 and the row. This may be done by providing ribs 64 (FIG. 11) such that the jumper caps 54 can only be placed in a particular position to engage specific pins 46. In this case, the bottom portion 60 of the housing 56 may have a different mold shape for each type of pin selector 52 to define the particular connection arrangement of the pin selector 52. As shown in FIG. 9, the bottom portion 60 may also have a label 66 for the particular connection arrangement molded into the bottom portion 60. If desired, the top portion 58 may have a single molded shape for all types of pin selectors 52. For a visual marking, the top portion 58 may have a printed identification 68 that matches the particular bottom portion 60 and connectors 54 therein. In the assembled pin selector 52, the top and bottom portions 58, 60 of the housing 56 are permanently snapped together with the jumper caps 54 trapped between the top and bottom housing portions 58, 60. It may be desirable for the pin selectors 52 to have a finger grip 70 that allows the pin selector 52 to be easily grasped to connect and disconnect the pin selectors 52 with the pin sets 14. As shown in FIGS. 7-8, it may be desirable to provide a visual identification 68 of the type of pin selector 52 on the top of each pin selector 52 to be able to identify the pin selectors 52 when they are connected to the pin sets 14.

As shown in FIG. 8, it may also be desirable to provide a pin selector key 72 for each pin selector 52. The pin selector key 72 is provided with a key surface 74 that mates with a corresponding key surface 76 on a matching pin selector 52. In the embodiment shown, the key surface 74 on the pin selector key 72 may be one or more ribs 74 and the key surface 76 on the pin selector 52 may be one or more slots 76. Although other designs are possible, in the embodiment of FIG. 8, there may be three key surfaces 74, 76. In other pin selectors 52 and pin selector keys 72, the corresponding key surfaces 74, 76 may be in different locations or may be different shapes, sizes, etc. As a result, only the type of pin selector 52 that matches the pin selector key 72 (e.g., EPD LV pin selector key 72 and EPD LV pin selector 52) can be inserted into the pin selector key 72. That is, the key surfaces 74 of the pin selector key 72 prevent non-mating pin selectors 52 from being inserted into the pin selector key 72. Preferably, the pin selector keys 72 have a portion 78 that extends up near the top of the corresponding pin selector 52 and a visual identification 80 of the type of matching pin selector 52 is provided thereon. Thus, the user can easily see and match up the pin selector keys 72 and pin selectors 52. It is thus understood that in the described embodiment, there will be six different types of pin selector keys 72 to match the six different types of pin selectors 52.

Figure 6:
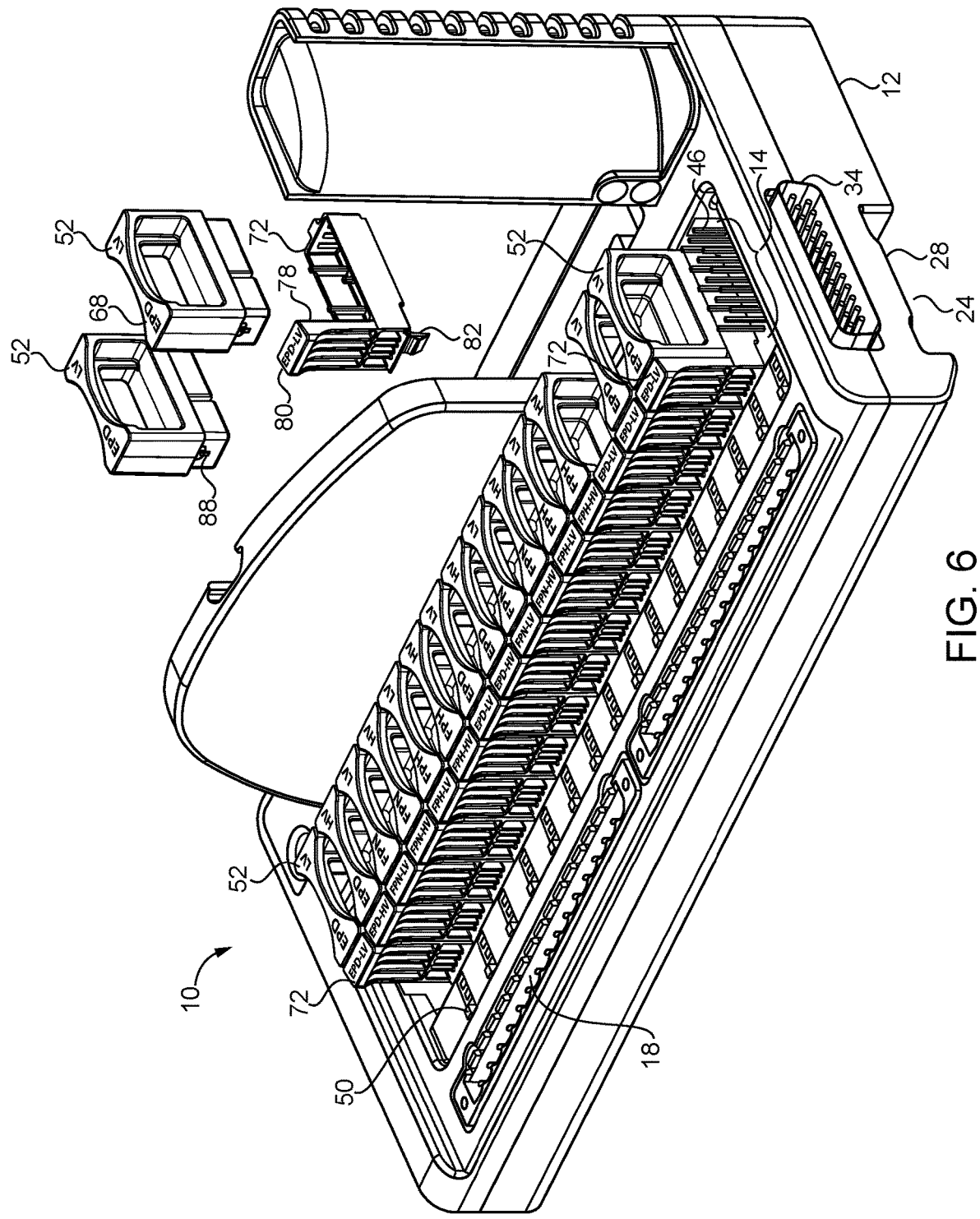
FIG. 6 is a perspective view of the universal communications module showing pin selectors and a pin selector key disconnected from the base.

In use, the pin selector key 72 preferably has a snap 82 that allows the pin selector key 72 to be snapped onto the base 12 to connect it onto (i.e., around) one of the pin sets 14 (see also FIG. 6). Typically, the placement of the pin selector keys 72 on the pin sets 14 will be determined by the initial design of the control system during setup. The bottom surface of the pin selector key 72 has one or more openings 84 that allow the pins 46 of the pin set 14 to extend up into the pin selector key 72 (FIG. 9). A matching pin selector 52 may then be pressed down into the pin selector key 72 and onto the pin set 14 until the pins 46 extend up into the bottom pin holes 86 in the pin selector 52 to engage with the connectors 54 within the pin selector 52. The pin selectors 52 are also provided with a snap 88 (FIG. 8) that snaps into the pin selector key 72 to retain the pin selector 52 onto the pin set 14. However, the retention force of the pin selector key snap 82 onto the base 12 is greater than the pin selector snap 88 onto the pin selector key 72. This allows the pin selectors 52 to be pulled out and disconnected from the pin sets 14 without removing the pin selector keys 72 (see, e.g., the pin selector key 72 and pin selector 52 at the fourth position from the right in FIG. 6).

An advantage of this arrangement is that after a communications module 10 has been set up in the field, maintenance people may wish to test the field wires 44 and/or field devices 38 by disconnecting the field device connectors 18 from the power supply 22 and signal processing module 36. In the described embodiment, this may be achieved by pulling out and removing the pin selectors 52. After testing, the pin selectors 52 must be reinstalled onto the pin sets 14 in order to reconnect the power supply 22 and signal processing module 36. However, it is critical that the pins 46 in each pin set 14 be reconnected in the correct arrangement to ensure that the field devices 38 operate correctly and no damage occurs to the field devices 38. The pin selector keys 72 solve this concern, since during testing, the pin selector keys 72 remain on the base 12 connected to the respective pin sets 14. As a result, when the pin selectors 52 are reinstalled, it is only possible to install pin selectors 52 that match the corresponding pin selector keys 72. Thus, it is easy to reconnect the pins 46 in the correct arrangement after testing.

Figure 10:
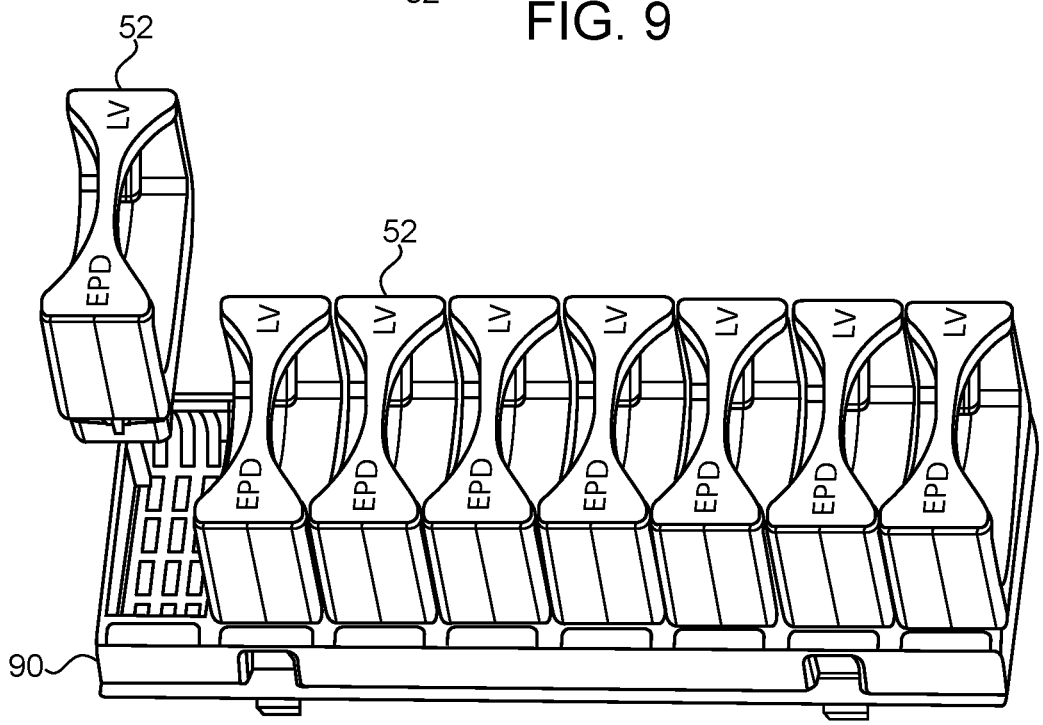
FIG. 10 is a perspective view of pin selectors and a generic tray.

As shown in FIG. 10, is also possible to provide a generic tray 90 to replace the pin selector keys 72 if the key matching function is not needed or desired. Of course, it may also be possible to directly connect the pin selectors 52 onto the pin sets 14 without the pin selector keys 72 or generic tray 90 if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A selector for field devices, comprising:
a field device connector;
a set of pins, a portion of the set of pins being connected to the field device connector, and another portion of the set of pins being connected to a power supply or a signal processor;
a first pin selector and a second pin selector, the first and second pin selectors each comprising a housing with one or more connectors to connect together only a portion of the pins in the set of pins, an arrangement of the one or more connectors in the first pin selector being different from an arrangement of the one or more connectors in the second pin selector such that the first pin selector connects together a different portion of the pins than the second pin selector;
wherein an interconnection between the field device connector and the power supply or signal processor is different when the first pin selector is connected onto the set of pins than when the second pin selector is connected onto the set of pins.

2. The selector according to claim 1, further comprising a base with a plurality of the field connector and a plurality of the set of pins, each field connector and each set of pins comprising a data channel in communication with the signal processor, wherein each of the data channels is separately configurable by connecting either the first pin selector or the second pin selector onto the respective set of pins.

3. The selector according to claim 2, wherein the base comprises a module connector and a signal processing module comprising the signal processor being connected the module connector.

4. The selector according to claim 3, wherein the signal processing module comprises a plurality of the signal processor, one of the signal processors being connected to each of the set of pins.

5. The selector according to claim 4, wherein each of the signal processors condition and/or convert data transmitted to or from each field device connector without applying control logic between separate data channels, and the base further comprising a data port for communicating data between the signal processors and a process controller, the process controller applying control logic to data between separate data channels.

6. The selector according to claim 1, wherein the first pin selector connects the power supply to the field device connector, and the second pin selector disconnects the power supply from the field device connector.

7. The selector according to claim 1, wherein the power supply comprises first and second power connectors and the field device connector comprises first and second device connectors, the first pin selector directly connecting together the first power connector with the first device connector and connecting the second power connector and the second device connector to the signal processor, and the second pin selector directly connecting together the second power connector with the second device connector and connecting the first power connector and the first device connector to the signal processor.

8. The selector according to claim 1, further comprising a voltage output connected to the set of pins, the first pin selector adjusting a voltage from the power supply to the voltage output relative to the second pin selector.

9. The selector according to claim 1, wherein the field device connector is disconnected from the power supply and the signal processor when none of the pins in the set of pins are connected to each other.

10. The selector according to claim 1, further comprising a plurality of the field device connector and a plurality of the set of pins, each field device connector and each set of pins comprising a data channel in communication with the signal processor, the signal processor conditioning and/or converting data transmitted to or from each field device connector without applying control logic between separate data channels, and further comprising a data port for communicating data between the signal processor and a process controller, the process controller applying control logic to data between separate data channels.

11. The selector according to claim 1, wherein the housings of the first and second pin selectors each comprise a finger grip for connecting and disconnecting the respective first and second pin selectors with the set of pins, and the housings each comprising a different visual marking identifying the first and second pin selectors from each other.

12. The selector according to claim 1, wherein the housings of the first and second pin selectors each comprise a cavity to receive a printed circuit board jumper cap, the cavity in the housing for the first pin selector being in a different location relative to the cavity in the housing for the second pin selector such that the respective printed circuit board jumper cap in the first and second pin selectors each engage a different pair of pins in the set of pins.

13. The selector according to claim 1, wherein the housings of the first and second pin selectors each comprise a separate top housing portion, a separate bottom housing portion and the one or more connectors disposed between the top and bottom housing portions, the top and bottom housing portions being secured together to entrap the one or more connectors therebetween.

14. The selector according to claim 13, wherein the top and bottom housing portions are each molded plastic components, one of the top and bottom housing portions comprising a different molded shape in the first pin selector than in the second pin selector to define different arrangements of the one or more connectors therein.

15. The selector according to claim 1, further comprising a pin selector key connected to the set of pins, the pin selector key comprising a first key surface, wherein the first and second pin selectors each comprise second key surfaces, the second key surface of the first pin selector being different from the second key surface of the second pin selector such that only the second key surface of either the first pin selector or the second pin selector mates with the first key surface of the pin selector key, non-mating first and second key surfaces preventing the respective first or second pin selector from being connected to the set of pins.

16. The selector according to claim 15, wherein the pin selector key comprises a first snap to connect the pin selector key to the set of pins, the first and second pin selectors each comprising a second snap to connect the respective first or second pin selector to the pin selector key, the first snap being defined by a greater retention than the second snap such that the respective first or second pin selector is removable from the pin selector key without removing the pin selector key from the set of pins.

17. The selector according to claim 15, further comprising a plurality of the field device connector, a plurality of the set of pins, and a plurality of the pin selector key, each field device connector and each set of pins comprising a data channel in communication with the signal processor, the plurality of the pin selector key comprising a first pin selector key and a second pin selector key, the first and second pin selector keys comprising different first key surfaces such that the first and second key surfaces of the first pin selector key and the first pin selector mate with each other and the first and second key surfaces of the second pin selector key and the second pin selector mate with each other.

18. The selector according to claim 17, wherein the first and second pin selector keys each comprise a different visual marking identifying the first and second pin selector keys from each other, the housings of the first and second pin selectors each comprising a different visual marking identifying the first and second pin selectors from each other, the visual markings of the first pin selector key and the first pin selector corresponding with each other, and the visual markings of the second pin selector key and the second pin selector corresponding with each other.

19. The selector according to claim 1, wherein the power supply and the signal processor are connected to first and second portions of the set of pins, the interconnection between the field device connector, the power supply and the signal processor being different when the first pin selector is connected onto the set of pins than when the second pin selector is connected onto the set of pins.

20. The selector according to claim 1, further comprising a third pin selector comprising a housing with one or more connectors to connect together only a portion of the pins in the set of pins, an arrangement of the one or more connectors in the third pin selector being different from an arrangement of the one or more connectors in the first and second pin selectors such that the third pin selector connects together a different portion of the pins than the first or second pin selectors, wherein the interconnection between the field device connector, the power supply and the signal processor is different when each of the first, second and third pin selectors is connected onto the set of pins.

* * * * *